(12) United States Patent
Kirikae et al.

(10) Patent No.: US 10,115,707 B2
(45) Date of Patent: Oct. 30, 2018

(54) ADHESIVE FILM AND SEMICONDUCTOR PACKAGE USING ADHESIVE FILM

(71) Applicant: FURUKAWA ELECTRIC CO., LTD., Tokyo (JP)

(72) Inventors: Noriyuki Kirikae, Tokyo (JP); Masami Aoyama, Tokyo (JP)

(73) Assignee: FURUKAWA ELECTRIC CO., LTD., Tokyo (JP)

(*) Notice: Subject to any disclaimer, the term of this patent is extended or adjusted under 35 U.S.C. 154(b) by 0 days.

(21) Appl. No.: 15/428,452

(22) Filed: Feb. 9, 2017

(65) Prior Publication Data

US 2017/0152408 A1 Jun. 1, 2017

Related U.S. Application Data

(63) Continuation of application No. PCT/JP2015/072714, filed on Aug. 10, 2015.

(30) Foreign Application Priority Data

Aug. 29, 2014 (JP) ................................. 2014-176257

(51) Int. Cl.
*H01L 25/065* (2006.01)
*C09J 4/00* (2006.01)
(Continued)

(52) U.S. Cl.
CPC ............ *H01L 25/0657* (2013.01); *C09J 4/00* (2013.01); *C09J 7/00* (2013.01); *C09J 7/0285* (2013.01); *C09J 7/20* (2018.01); *C09J 7/255* (2018.01); *C09J 7/30* (2018.01); *C09J 11/04* (2013.01); *C09J 11/06* (2013.01); *C09J 179/085* (2013.01); *H01L 21/52* (2013.01);
(Continued)

(58) Field of Classification Search
None
See application file for complete search history.

(56) References Cited

U.S. PATENT DOCUMENTS 7,851,930 B1 12/2010 Gupta
2004/0225026 A1 11/2004 Mizori et al.
(Continued)

FOREIGN PATENT DOCUMENTS

JP S60-196956 A 10/1985
JP H11-209713 A 8/1999
(Continued)

OTHER PUBLICATIONS

Dctober 13, 2015 International Search Report issued in International Patent Application No. PCT/JP2015/072714.
Feb. 28, 2017 International Preliminary Report on Patentability issued in International Patent Application No. PCT/JP2015/072714.
Mar. 21, 2018 extended European Search Report issued in Application No. 15835827.5.

*Primary Examiner* — Michelle Mandala
(74) *Attorney, Agent, or Firm* — Oliff PLC (57) ABSTRACT

An adhesive film that can solve the problem of pickup defect and improve the yield rate of semiconductor packages. The adhesive film includes: (A) a bismaleimide resin; (B) a radical initiator; and (C) a coupling agent that contains a (meth)acrylic group. Further, an adhesive film with dicing tape, which includes such an adhesive film laminated onto a dicing tape, is provided. Furthermore, a semiconductor package that includes such an adhesive film with dicing tape is provided.

13 Claims, 5 Drawing Sheets

(51) Int. Cl.
*C09J 7/00* (2018.01)
*C09J 11/06* (2006.01)
*H01L 21/52* (2006.01)
*H01L 23/00* (2006.01)
*C09J 7/02* (2006.01)
*C09J 11/04* (2006.01)
*C09J 179/08* (2006.01)
*H01L 21/683* (2006.01)
*C09J 7/20* (2018.01)
*C09J 7/30* (2018.01)
*C09J 7/25* (2018.01)

(52) U.S. Cl.
CPC ........ H01L 21/6836 (2013.01); H01L 24/27 (2013.01); H01L 24/32 (2013.01); H01L 24/48 (2013.01); H01L 24/83 (2013.01); *H01L 2224/3224* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/8385* (2013.01); *H01L 2224/83191* (2013.01); *H01L 2224/92247* (2013.01); *H01L 2225/0651* (2013.01); *H01L 2225/06555* (2013.01); *H01L 2924/00014* (2013.01); *H01L 2924/181* (2013.01); *H05K 999/99* (2013.01)

(56) References Cited

U.S. PATENT DOCUMENTS

| | | |
|---|---|---|
| 2005/0222330 A1* | 10/2005 | Takano ............... C08F 8/30 525/73 |
| 2008/0020157 A1 | 1/2008 | Larson et al. |
| 2009/0087591 A1 | 4/2009 | Larson et al. |
| 2010/0113643 A1 | 5/2010 | Dershem |
| 2011/0018127 A1 | 1/2011 | Lee |
| 2013/0299747 A1 | 11/2013 | Dershem |
| 2014/0202737 A1* | 7/2014 | Shanai ............... C09J 7/0242 174/251 |

FOREIGN PATENT DOCUMENTS

| | | |
|---|---|---|
| JP | 2006-526014 A | 11/2006 |
| JP | 2008-248189 A | 10/2008 |
| JP | 2009-111276 A | 5/2009 |
| JP | 2009-544768 A | 12/2009 |
| JP | 2010-028087 A | 2/2010 |
| JP | 2010-059387 A | 3/2010 |
| JP | 2010-539293 A | 12/2010 |
| JP | 2011-001473 A | 1/2011 |
| JP | 2011-228642 A | 11/2011 |
| WO | 2009/067113 A1 | 5/2009 |
| WO | 2012/0160916 A1 | 11/2012 |

* cited by examiner

ADHESIVE FILM AND SEMICONDUCTOR PACKAGE USING ADHESIVE FILM

This is a Continuation of International Application No. PCT/JP2015/072714 filed Aug. 10, 2015, which claims the benefit of Japanese Application No. 2014-176257 filed Aug. 29, 2014. The disclosure of the prior applications is hereby incorporated by reference herein in its entirety.

TECHNICAL FIELD

The present invention relates to an adhesive film, which utilizes bismaleimide resin and a coupling agent that contains methacrylic group and/or acrylic group in combination, to thereby realize high productivity of semiconductor packages, as well as semiconductor package that utilizes the same.

BACKGROUND ART

Adhesive resin compositions are used for various purposes in the production and assembly of microelectronic devices such as semiconductor packages. More noticeable uses are the bonding of electronic devices such as integrated circuit chips onto lead frames or other substrates, and the bonding of circuit packages and assembly onto printed circuit boards. In such adhesion processes, the adhesive resin composition is required to flow and fill the space between the adherends so that no bubbles (void) enter the boundary of the adherends, and further, to avoid the generation of voids by heating during the sealing, reflow or mounting process following the adhesion process. In devices in which voids are generated, peeling occurs at the boundary and become insufficient in reliability. Further, if the adhesion is insufficient, wire bonding defect may occur, or the sealing resin may enter the boundary during the sealing process.

Further, in recent years, multi-stage mounting of semiconductor chips and three-dimensional mounting, in which different semiconductors are laminated and connected, are being actively pursued, causing the time in which semiconductor products are subjected to heat to lengthen. Thus, highly reliable adhesive resin compositions that show high resistivity against thermal history are required. In regard to such subject, for example, in Patent Document 1, an adhesive film for semiconductor, which comprises an acrylic copolymer containing glycidyl group, is disclosed.

RELATED ART

Patent Documents

Patent Document 1: JP-A-2010-028087
Patent Document 2: JP-A-2011-228642

SUMMARY

In an adhesive film that comprises an epoxy resin as the main agent, a curing agent, a filler, and a sheet-formation agent, because a high molecular weight noncrosslinkable polymer must be blended as the sheet-formation agent, the content ratio of the filler cannot be increased. Thus, there were high restrictions in material construction, in order to express cured material properties (such as heat resistance, water absorbency, thermal conductivity, electric conductivity, etc.) that are necessary to assure reliability of semiconductor devices.

On the other hand, in adhesive films containing bismaleimide resin, a radical initiator and a filler as the main agent, because bismaleimide resins show high heat-resistance and low water absorbency, as well as sheet formation property, even though the bismaleimide resin is an oligomer, a sheet-formation agent becomes unnecessary. Hence, the viscosity of the resin component in the adhesive film can be drastically reduced, and the content ratio of the filler can be significantly increased.

Since bismaleimide resin shows high hydrophobicity, it is poor in compatibility with other thermosetting resins. Thus, controlling the viscosity of the resin component in the adhesive film becomes difficult. For this reason, surface tack (stickiness) cannot be restrained, and in the production process of semiconductor packages, when picking up the silicon chip with adhesive film from the dicing tape, the silicon chip with adhesive film cannot be picked up from the dicing tape, causing the problem of substantial decrease in production yield percentage of semiconductor packages.

The present invention was made in view of the above-described problems and its object is to provide an adhesive film that solves the problem of pickup defects and improves production yield rate of semiconductor packages.

That is, the present invention relates to an adhesive film, which comprises: (A) a bismaleimide resin; (B) a radical initiator; and (C) a coupling agent that contains a (meth) acrylic group.

Further, the present invention relates to the adhesive film wherein the content of the (A) bismaleimide resin is 1 to 50 percent by mass, the content of the (B) radical initiator is 0.1 to 5 percent by mass, and the content of the (C) coupling agent that contains a methacrylic group and/or an acrylic group is 0.1 to 5 percent by mass.

Further, the present invention relates to an adhesive film with dicing tape, which comprises the adhesive film laminated onto a dicing tape.

Furthermore, the present invention relates to a semiconductor package that utilizes and comprises the adhesive film with dicing tape.

Effect of the Invention

According to the present invention, the problem of pickup defect can be solved and an adhesive film that can improve the yield rate of semiconductor packages, as well as semiconductor packages of high reliability that utilize such adhesive film is successfully produced.

DESCRIPTION OF SOME EMBODIMENTS ((A) Bismaleimide Resin)

In the present specification, "bismaleimide" or "BMI" refers to a polyimide compound, wherein two maleimide parts are connected. That is, it is the polyimide compound having the general structure shown in the following general formula (1).

[Chemical Formula 1]

Q is a substituted or unsubstituted aliphatic, aromatic, heteroaromatic, siloxane part, or a combination thereof.

Further, Q preferably has a structure in which an alicyclic hydrocarbon with 5 to 8 carbons is substituted by four alkyl groups with 4 to 12 carbons. Such structures contain long arms of long alkyl chains, and show excellent stress relaxation effect. Further, since it is formed of alicyclic and aliphatic groups, it shows excellent moisture resistance.

In particular, for example, a structure containing a cyclohexane-based core and four long arms attached to the core (hereinafter referred to in the present description as "$C_{36}$"), shown in the following general formula (2), is preferable.

General Formula (2)

[Chemical Formula 2]

As the bismaleimide resin of the present invention, that shown in the following general formula (3) may be listed.

General Formula (3)

[Chemical Formula 3]

[Chemical Formula 4]

[Chemical Formula 5]

[Chemical Formula 6]

-continued

[Chemical Formula 7]

-continued

[Chemical Formula 8]

-continued

As other structures, maleimide resins disclosed in, for example, US 2010/0113643, US 2013/0299747 comprising the structure specified in the present invention may be listed. However, they are not limited to the above.

As the content of the (A) bismaleimide resin, it is preferably within the range of 1 to 50 percent by mass of the adhesive film.

((B) Radical Polymerization Initiator)

As the radical initiator, any compound that is capable of initiating radical polymerization by heat may be used, and is not particularly limited. Those that are conventionally used may be suitably used. For example, 1,2-dimethyl imidazole, 2-phenyl imidazole, 2,6-lutidine, triethylamine, m-hydroxybenzoic acid, 2,4-dihydroxy benzoic acid, p-hydroxyphenylacetic acid, 4-hydroxyphenylpropionic acid, peroxides such as dicumyl peroxide and 2,5-dimethyl-2,5-di(t-butyl peroxy) hexene, 2,3-dimethyl-2,3-diphenyl butane, 3,4-dimethyl-3, 4-diphenyl hexyne, etc. may be listed.

The radical initiator that is preferable in performing the present invention has a one-hour half-life temperature of 140° C. or higher, more preferably, a one-hour half-life temperature of 170° C. or higher, and even more preferably, a one-hour half-life temperature of 200° C. or higher. Further, the one-hour half-life temperature of the radical initiator is preferably 250° C. or lower.

The content of the radical polymerization initiator is preferably in the range of 0.1 to 5 percent by mass. If the content of the radical polymerization initiator is 0.1 percent by mass or more, the polymerization reaction proceeds sufficiently, and if it is 5 percent by mass or less, the degradation of properties such as pickup success rate due to unreacted residual components can be sufficiently restrained.

((C) Coupling Agent)

In the present invention, the coupling agent facilitates the bonding between the adhesive film and the adherend. In principle, the (C) coupling agent chemically reacts with the (A) bismaleimide resin, which is added as the thermosetting resin, and the (B) radical initiator, whereby crosslinking proceeds gently in a range that does not impair the low-temperature adhesive strength of the adhesive film against silicon wafers significantly, so that the peeling strength (peel strength) with the dicing tape decreases, leading the silicon chip with adhesive film to be easily picked up.

Note that such effect is only expressed with the use of a coupling agent that contains methacrylic group and/or acrylic group (hereinafter referred to as "(meth)acrylic goup"), but since it is preferable that crosslinking proceeds in a range that does not impair the low-temperature adhesive strength of the adhesive film against silicon wafers significantly, the coupling agent is preferably one that contains a meth(acrylic) group.

Specifically, a coupling agent that is compatible with the other components of the present invention may be used. Further, those that participate in radical curing reaction may be used. For example, mercaptosilane-type, acryl-type, γ-mercaptopropyltrimethoxy silane, γ-methacryloxy propyltrimethoxy silane, γ-aminopropyltrimethoxy silane, and vinyltrimethoxy silane may be listed. Silicate esters, metal acrylate salts (for example, aluminum(meth)acrylate), titanate (for example, titanium(meth)acryloxyethylacetoacetate triisopropoxide), or a compound that contains a copolymerizable group and a chilating ligand (for example, phosphine, mercaptan, acetoacetate and others of the same type) may be listed.

In several embodiments, the coupling agent contains both a copolymerizable functional group (for example, vinyl group, acrylate group, methacrylate group, and those of the same type) and a silicate ester functional group. When the adherend or the later-described filler is a metal, the silicate ester part of the coupling agent can undergo condensation with the metal hydroxide on its surface. On the other hand, the copolymerizable functional group can undergo copolymerization with the other reactable components of the adhesive film of the present invention.

The coupling agent containing a (meth)acrylic group may be added in the range of 0.1 percent by mass to 5 percent by mass, and more preferably, in the range of 0.1 to 1 percent by mass. When the content of the coupling agent with (meth)acrylic group is 0.1 percent by mass or more, the crosslinking reaction proceed sufficiently, and when it is 5 percent by mass or less, property change such as pickup success rate due to unreacted residual contents may be inhibited sufficiently.

(Polymer Component)

In the present invention, a polymer component may be included to facilitate film formation.

Further, the polymer component may further contribute to the stress-relaxation property. The polymer component may be any type as long as it is easy to handle and shows compatibility with the curable resin. Examples of favorable resins are thermoplastic resins that are hydrophobic and soluble to toluene. When the polymer component shows compatibility with the curable resin, the thermoplastic resin and the curable resin is most-likely soluble to the same solvent, and as such solvent, an aromatic solvent may be exemplified. Examples of usable solvents are toluene and xylene.

As a thermoplastic resin that is hydrophobic and soluble to toluene, for example, a styrene-butadiene block copolymer, a styrene-isoprene block copolymer, a block copolymer of a mixture of styrene butadiene isoprene, may be listed. The block copolymer of styrene and butadiene that is useful in the present invention may be a di-block copolymer, which contains a styrene polymer segment and a butadiene polymer segment that are covalently bonded to each other. The block copolymer of styrene and butadiene that is useful in the present invention may also be a tri-block copolymer, which contains two segments of styrene polymer and one segment of butadiene polymer, wherein each of the styrene polymer segments are covalently bonded with the butadiene polymer segment.

Another block copolymer of styrene and butadiene that is useful in the present invention may be a block copolymer of styrene and butadiene wherein the butadiene segment is hydrogenated. Further, it may be a tri-block copolymer that contains a styrene polymer segment, a butadiene polymer segment, and a methacrylate ester polymer segment. Other than styrene block copolymers, polyimide precursors such as polyamic acids, polyamic acid esters, and polyamic acid amides, poly-THF, carboxy-terminal butadiene-acrylonitrile rubber, and polypropylene glycol, are favorable. Further, any polymer component of phenoxy, acrylic rubber, polyimide, polyamide, polyacrylate, polyether, polysulfone, polyethylene, polypropylene, polysiloxane, polyvinyl acetate/polyvinyl ester, polyolefin, polycyanoacrylate, which show compatibility with the curable resin, may be suitably used. Furthermore, thermoplastic resins that contain polymer segments equipped with reactive double bonds are capable of reacting with the curable resin during the curing process activated by the radical.

When the mass-average molecular weight of the polymer component is 10,000 or more, excellent film formation easiness is obtained. Further, when the mass-average molecular weight is 1,000,000 or less, excellent moisture resistance and flowability during affixation of the film with the adherend is obtained. A mass-average molecular weight of 200,000 or less is more preferable, and that of 100,000 or less is further preferable. The mass-average molecular weight can be measured by gel permeation chromatography (GPC) (standard polystyrene conversion). In a specific embodiment, when the compounding ratio of the polymer component is 5 percent by mass or more based on the total mass of the resin component in the film, excellent film formation easiness is obtained. Further, when the compounding ratio of the polymer component is 50 percent by mass or less, excellent moisture resistance and flowability during affixation of the film with the adherend is obtained. A compounding ratio of 40 percent by mass or less is more preferable, and 30 percent by mass or less is further preferable.

(Arbitrary Curing Component Other than (A))

In the present invention, curable components other than bismaleimide resin may be included. The curable component is not particularly limited. For example, (meth)acrylate compounds having an amide bond in the molecule, acid modified (meth)acrylate, bisphenol A-type (meth)acrylate, compounds obtained by reacting α, β-unsaturated carboxylic acids to polyhydric alcohols, compounds obtained by reacting α,β-unsaturated carboxylic acids to glycidyl-group-containing compounds, urethane monomers or urethane oligomers such as (meth)acrylate compounds having urethane bonds within the molecule, etc. may be listed. Further, nonylphenoxypolyoxy ethylene acrylate, phthalic acid-type compounds such as γ-chloro-β-hydroxypropyl-β'-(meth) acryloyloxyethyl-o-phthalate and β-hydroxyalkyl-β'-(meth) acryloyloxyalkyl-o-phthalate, (meth)acrylic acid alkyl ester, EO-modified nonylphenyl(meth)acrylate, etc., may be exemplified.

In one embodiment, a compound containing isocyanulate ring may be used. In another embodiment, a compound having a tetrahydrofuran structure may be used. These compounds may be used singularly or two or more types may be used in combination. In a specific embodiment, when the compounding ratio of the curable component other than the curable resin is 2 percent by mass or more based on the total mass of the resin component in the film, it is excellent from the view point of flowability during affixation of the film with the adherend and improvement of curability. Further, from the view point of stress relaxation property, 50 percent by mass or lower is preferable.

(Filler)

The present invention may contain a filler. By adding a filler, functions according to the filler may be added to the adhesive film. On the other hand, when a filler is not added, the film may be superior in stress relaxation property and high flowability. The filler may be an organic filler, an inorganic filler, or a metallic filler. Organic fillers are favorable in that they can add toughness to the film, and fillers such as acryl, polyimide, polyamideimide, polyetheretherketone, polyetherimide, polyesterimide, nylon, and silicone may be listed. Inorganic fillers and metallic fillers can improve handling property, improve thermal conductivity, add electric conductivity, control melt viscosity, and improve addition of thixotropic property. The metallic fillers are not particularly limited and may be, for example, gold, silver, copper, aluminum, iron, indium, tin, and alloys thereof. Inorganic fillers are not particularly limited, and may be, for example, aluminum hydroxide, magnesium hydroxide, calcium carbonate, magnesium carbonate, calcium silicate, magnesium silicate, calcium oxide, magnesium oxide, alumina, aluminum nitride, aluminum borate whisker, boron nitride, crystalline silica, and amorphous silica. The form of the filler is not particularly limited. Such fillers may be used singularly or two or more types may be used in combination.

For the purpose of controlling melt viscosity and adding thermal resistance, alumina, silica, aluminum hydroxide etc. are preferable, and silica is more preferable for its versatility. The silica is preferably spherical silica, since it enables the formation of thin adhesive films, and because it enables adding the filler in high ratio.

(Flux)

When the filler is conductive, it is preferable that the adhesive film contains a flux. The flux is useful in removing the surface oxide film on the conductive filler. As the flux, any compound may be used without particular limitation, as long as the compound does not hinder the curing reaction of the curable resin and other curable resins. For example, polyhydric alcohols, carboxylic acids, inorganic acids, alkanolamines, phenols, rosins, chloride compounds and their salts, halide compounds and their salts etc. may be listed. As the flux, a single type may be used or two or more types may be used in combination.

In a specific embodiment, the flux is composed of a salt or mixture of carboxylic acid and tertiary amine, and may be of potentiality. In another embodiment, the flux may be inactivated at the completion of the heat treatment of the adhesive film, in which case, it is inactivated by insertion through the reaction between the functional group of the flux and the curable resin.

(Other Arbitrary Components)

In another embodiment, one or more additive(s) such as a plasticizer, an oil, a stabilizer, an antioxidant, a corrosion preventative, an inhibitor, a chelating agent, a pigment, a dye, a polymer additive, a defoaming agent, a preservative, a thickener, a rheology-adjusting agent, a moisturizing agent, a tackifier, a dispersant, or water may be added.

(Method for Producing Adhesive Film)

The adhesive film of the present invention is produced by dissolving and homogeneously dispersing (A) a bismaleimide resin, (B) a radical initiator, and (C) a coupling agent that contains a methacrylic group and/or an acrylic group in a solvent (such as xylene, cyclopentane, etc.) to obtain an adhesive composition varnish, and applying the varnish on a cover film so that a specific thickness is obtained to form a coated layer, then drying the coated layer under a specific condition. The method of application is not particularly limited and may be, for example, roll coating, screen coating, or gravure coating. Further, as the drying condition, for example, drying may be performed at a temperature of 70 to 160° C. for a time range of 1 to 5 minutes. As the cover film, polyethylene terephthalate (PET), polyethylene, polypropylene, or plastic films and paper with a peeling agent such as fluorine-type peeling agent and long-chain alkylacrylate-type peeling agent coated on the surface thereof, may be used.

The thickness of the adhesive film is not particularly limited, but may preferably be 1 to 300 µm. When adhering two layers of adherends, the thickness is preferably 5 to 60 µm and when stress-relaxation property is required, the thickness is preferably 60 to 200 µm.

Further, by combining the adhesive film with a dicing tape in the form of a laminate, the adhesive film may be used favorably as an adhesive film with dicing tape. A dicing tape is a tape that is used mainly in the process of cutting and dicing integrated circuits formed on a silicon wafer and packages.

Since the adhesive film is radically curable, it may be used in combination with a dicing tape that has a radiation curable adhesive layer that is irradiated beforehand, or a pressure-sensitive adhesive layer, on the part that is to be adhered to the wafer.

Figure 1:
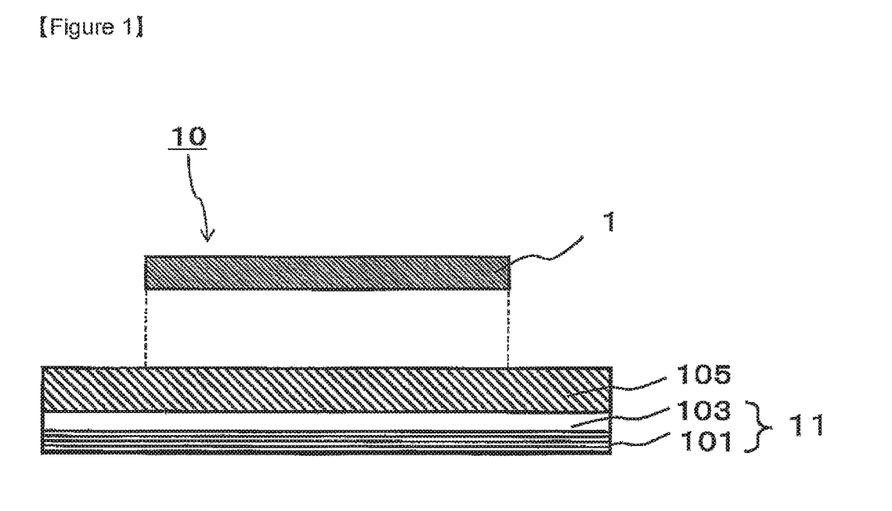
FIG. 1 shows an adhesive film with dicing tape that utilizes and comprises the adhesive agent of the present invention.

FIG. 1 is a schematic diagram that shows a sectional view of one embodiment of the adhesive film with dicing tape of the present invention.

In FIG. 1, the structure of the adhesive film with dicing tape 10, in which the adhesive film 105 is laminated on the dicing tape 11, is shown. The dicing tape 11 is composed pressure-sensitive adhesive layer 103 laminated on a substrate 101, and the adhesive film 105 is provided on top of the pressure-sensitive adhesive layer 103. As shown in the adhesive film with dicing tape 3 of FIG. 2, the adhesive layer 2 may be formed only on the work-sticking part.

The substrate 1 is the strength matrix of the adhesive film with dicing tape 10 and preferably shows ultraviolet transmission property and expandability when expanded. For example, polyolefins such as polyethylene, polypropylene, polybutene, and polymethylpentene, ethylene-vinyl acetate copolymer, ionomer resin, ethylene-(meth)acrylic acid copolymer, ethylene-(meth)acrylic acid ester (random, alternating) copolymer, ethylene-butene copolymer, ethylene-hexene copolymer, polyurethane, polyesters such as polyethylene terephthalate and polyethylene naphthalate, polycarbonate, polyimide, polyetheretherketone, polyether imide, wholly aromatic polyamide, polyphenylsulfide, aramid (paper), glass, glass cloth, fluorine resin, polyvinylchloride, polyvinylidenechloride, cellulose-type resin, silicone resin, crosslinked bodies of the aforementioned resins, metal (foil), paper etc. may be listed.

In order to enhance adhesion, retention, etc., the surface of the substrate 101 may be subjected to conventional surface treatments such as various chemical and physical treatments such as chromic acid treatment, ozone exposure, flame exposure, high voltage lightening exposure, ionizing radiation treatment, coating treatment using primers (such as the later-described adhesive substance).

As the substrate 101, the same or different materials may be appropriately selected and used, and several types may be blended and used as necessary. Further, different types may be layered and used.

The thickness of substrate 101 is not particularly limited, but may generally be about 50 to 200 µm.

The adhesive agent used to form the pressure-sensitive adhesive layer 103 is not particularly limited, and general pressure-sensitive adhesives such as acrylic-type adhesive agents and rubber-type adhesive agents may be used.

As the adhesive agent used to form the pressure-sensitive adhesive layer 103, radiation-curable resins may also be used. The adhesive force of radiation-curable resins may easily be reduced by irradiation of radiation such as ultraviolet ray to increase the degree of crosslinking.

As the radiation-curable adhesive agent, those having radiation curable functional groups such as carbon-carbon double bonds that also show adhesiveness may be used without particular limitation. For example, addition-type radiation-curable adhesive agents obtained by combining radiation-curable monomer components and oligomer components to general pressure-sensitive adhesive agents such as the aforementioned acrylic-type adhesive agent and rubber-type adhesive agent may be exemplified.

As the radiation-curable monomer component to be combined, for example, urethane oligomer, urethane(meth)acrylate, trimethylol propane tri(meth)acrylate, tetramethylol methane tetra(meth)acrylate, pentaerythritol tri(meth)acrylate, pentaerythritol tetra(meth)acrylate, dipentaerythritol monohydroxy penta(meth)acrylate, dipentaerythritol hexa(meth)acrylate, 1,4-butanediol di(meth)acrylate etc. may be listed. Further, as the radiation-curable oligomer component, various oligomers such as urethane-type, polyether-type, polyester-type, polycarbonate-type, polybutadiene-type etc. may be listed, and those with a molecular weight in the range of 100 to 30000 are suitable. The amount of radiation-curable monomer components and oligomer components may be determined appropriately according to the type of adhesive layer. In general, the amount is, for example, 5 to 500 parts by mass, or more preferably, 40 to 150 parts by mass, based on 100 parts by mass of the base polymer such as the acrylic polymer composing the adhesive layer.

Further, as the radiation-curable adhesive agent, other than the aforementioned addition-type radiation-curable adhesive agent, endogenous-type radiation-curable adhesive agents that contain carbon-carbon double bonds on the polymer side chain, main chain, or end of the main chain may be listed as the base polymer. Such endogenous-type radiation-curable adhesive agents do not require the addition of oligomer components etc., or do not contain many. Thus, they are preferable since chronological migration of the oligomer components within the adhesive agent or to the adhesive film 105 does not occur.

Further, as the radiation-curable adhesive agent, for example, an addition polymerizable compound having two or more unsaturated bonds as disclosed in JP-A-S60-196956, rubber-type adhesive agents and acrylic-type adhesive agents containing a photo-polymerizable compound that has an epoxy group such as alkoxysilane and a photo-polymerization initiator such as carbonyl compounds, organic sulfur compounds, peroxides, amines, onium salt-type compounds etc. may be listed.

The thickness of the pressure-sensitive adhesive layer 103 is not particularly limited, but is preferably about 1 to 50 µm. Preferably, the thickness is 2 to 30 µm or further preferably, it is 5 to 25 µm.

FIG. 1 shows a clear example of the structure and method for producing a semiconductor device using such an adhesive film with dicing tape.

More specifically, on the semiconductor wafer-sticking part of the adhesive film 105 of the adhesive film with dicing tape 10, a semiconductor wafer 4 is pressure bonded, and fixed by adhesion holding (adhesion process). This process is performed by pressurizing using a pressurizing means such as a pressurizing roll.

<Method for Producing Semiconductor Package>

Hereinafter, a favorable embodiment of the method for producing semiconductor package of the present invention will be described in detail with reference to the Figures. Note that in the following description and the figures, the same or equivalent elements share the same notation, and redundant descriptions are omitted. FIG. 3 to FIG. 9 are schematic drawings that show longitudinal sectional views of one favorable embodiment of each process of the method for producing semiconductor package of the present invention.

Figure 2:
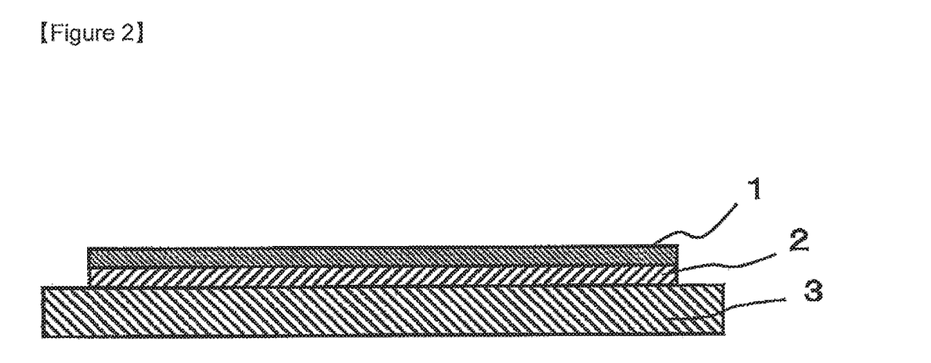
FIG. 2 is a sectional scheme of an embodiment of the adhesive film with dicing tape that differs from FIG. 1.

In the method for producing semiconductor package of the present invention, as the first process, as shown in FIG. 2, the adhesive film of the present invention is thermocompression bonded onto the back side of a wafer 1 with at least one semiconductor circuit formed on the surface, to thereby form an adhesive layer 2. Next, a wafer 1 and a dicing tape 3 is provided via the adhesive layer 2. Here, a product in which the adhesive layer 2 and the dicing tape 3 is integrated may be subjected to thermocompression bonding at once. As the wafer 1, a wafer with at least one semiconductor circuit formed on the surface may appropriately be used. For example, a silicon wafer, a SiC wafer, and a GaS wafer may be listed. As the adhesive layer 2, one layer of the adhesive film of the present invention may be used singularly or two or more layers may be laminated. As a method of arranging such an adhesive layer 2 on the back side of the wafer 1, a method that enables laminating the adhesive film on the back side of the wafer 1 may be appropriately adopted. A method of bonding the adhesive film on the back side of the wafer 1, then, when laminating two or more layers, laminating the adhesive film in sequence until a desired thickness is obtained, or a method of laminating the adhesive film to the intended thickness beforehand and bonding it to the back side of the wafer 1, may be listed. Further, the apparatus to be used when arranging the adhesive layer 2 on the back side of the wafer 1 is not particularly limited, and any known apparatus such as a roller laminator and a manual laminator may be used appropriately.

Figure 3:
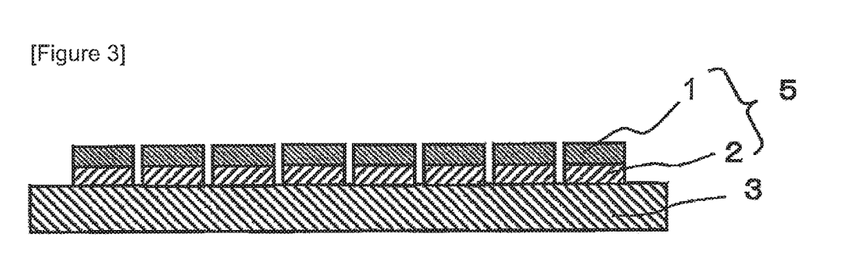
FIG. 3 shows a semiconductor chip with adhesive layer.

Next, in the method for producing a semiconductor package, as the second process, as shown in FIG. 3, by dicing the semiconductor chip 4 and the adhesive layer 2 at the same time, a semiconductor chip with adhesive layer 5, which comprises a semiconductor chip 4 and an adhesive layer 2, is obtained. The dicing tape 3 is not particularly limited, and known dicing tapes may appropriately be used. Further, the apparatus used for dicing is not particularly limited, and any known dicing apparatus may be appropriately used.

Note that a chip 4 refers to a piece of wafer 1 obtained by cutting into small piece.

Figure 4:
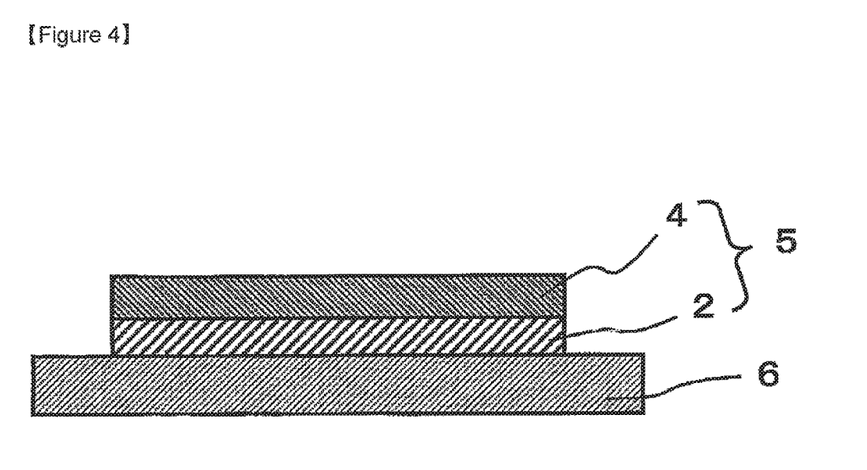
FIG. 4 shows a semiconductor chip with adhesive layer mounted on a circuit board.

Next, in the method for producing semiconductor package of the present invention, as the third process, as shown in FIG. 4, the adhesive layer 2 is picked up from the dicing tape 3, and the semiconductor chip with adhesive layer 5 and the circuit board 6 are thermocompression bonded via the adhesive layer 2, to thereby mount the semiconductor chip with adhesive layer 5 onto the circuit board 6. As the circuit board 6, a board with semiconductor circuit formed on its surface can appropriately be used. For example, a printed circuit board (PCB), various lead frames, and substrates with electronic components such as resistance elements and condensers mounted on the surface thereof may be listed.

In the present invention, component (C) chemically reacts with component (A) and component (B), whereby cross-linking proceeds gently in a range that does not impair the low-temperature adhesive strength of the adhesive layer 2 against the wafer 1 significantly, so that the peeling strength between the adhesive layer 2 and the dicing tape 3 decreases. Thus, the semiconductor chip with adhesive layer 4 can be easily picked up without the generation of DAF residue (a phenomenon of the adhesive layer 2 that is peeled from the wafer 1 remaining on the dicing tape 3 after pickup).

The method for mounting such semiconductor chip with adhesive layer 5 on the circuit board 6 is not particularly limited, and any conventional method that enables adhesion of the semiconductor chip with adhesive layer 5 on a circuit board 6 or an electronic part mounted on the surface of the circuit board 6 may be appropriately adopted. As such mounting method, various conventionally known heating and compressing methods such as a mounting method that utilizes a flip chip bonder that has a heating function from the top, a mounting method that utilizes die bonder that only has a heating function from the bottom, a method that utilizes a laminator, etc., may be listed.

By mounting the semiconductor chip with adhesive layer 5 on a circuit board 6 via an adhesive layer 2 that is composed of the film-form adhesive of the present invention, the film-form adhesive can track the roughness on the circuit board 6 caused by the electronic parts. Thus, the wafer 1 and the circuit board 6 can be adhered and fixed.

Next, in the method for producing a semiconductor package of the present invention, as the fourth process, the adhesive film is subjected to thermosetting. The temperature for thermosetting is not particularly limited as long as it is above the thermosetting initiation temperature of the adhesive film, and differs depending on the type of resin used, and thus cannot be limited as a rule. However, the temperature may preferably be, for example, 100 to 180° C. From the view point of enabling thermosetting in a shorter period of time with higher temperature, it is more preferably 140 to 180° C. When the temperature is below the thermosetting initiation temperature, the thermosetting does not proceed sufficiently, and the strength of the adhesive layer 2 tends to decrease. On the other hand, when the temperature exceeds the above maximum, the additives etc. in the film-form adhesive evaporate during the curing process and tend to foam. Further, the time for the thermosetting process may preferably be, for example, 10 to 120 minutes.

Figure 5:
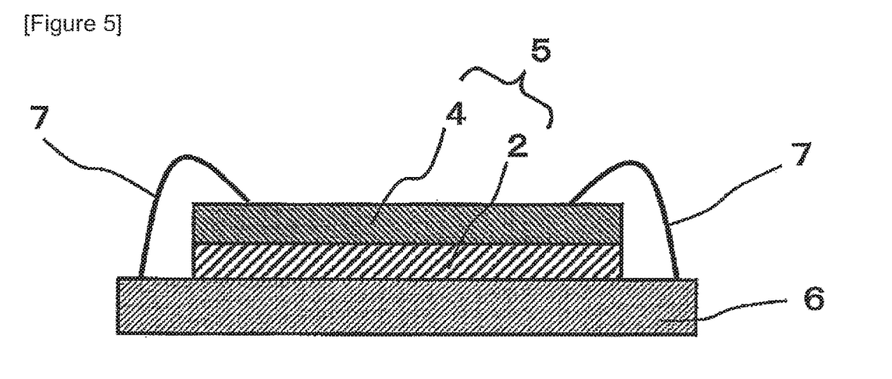
FIG. 5 shows a semiconductor chip with adhesive layer, mounted onto a circuit board via a bonding wire.

Next, in the method for producing semiconductor package of the present invention, as shown in FIG. 5, it is preferable that the circuit board 6 and the semiconductor chip with adhesive layer 5 are connected via a bonding wire 7. Such connection method is not particularly limited, and conventionally know methods such as a wire bonding method, TAB (Tape Automated Bonding) method etc., may be appropriately adopted.

Figure 6:
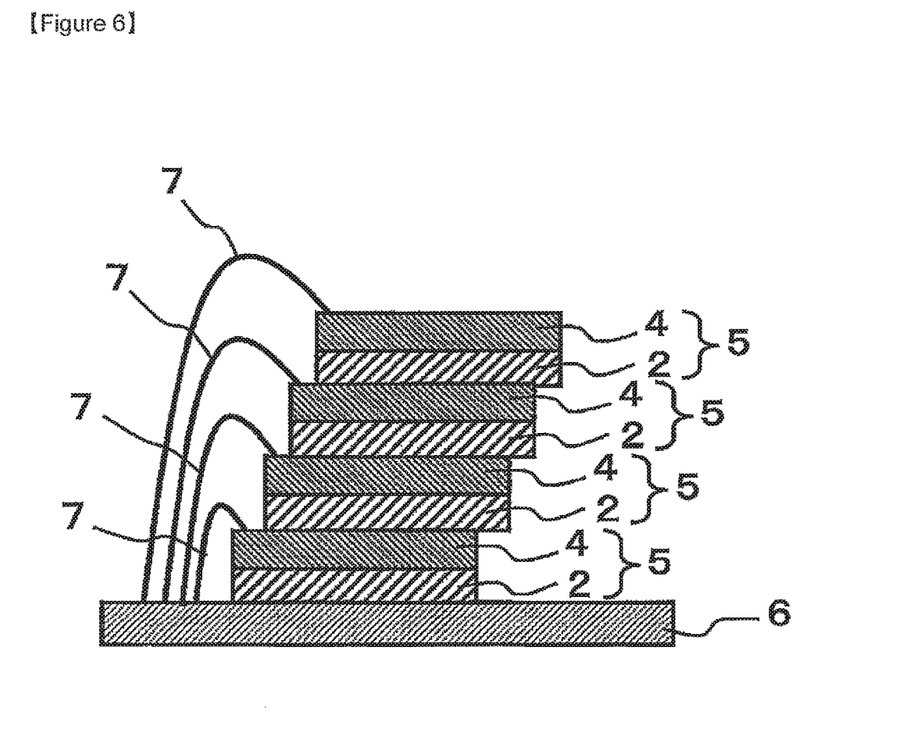
FIG. 6 shows a semiconductor chip with adhesive layer, laminated with the semiconductor chips shifted.
Figure 7:
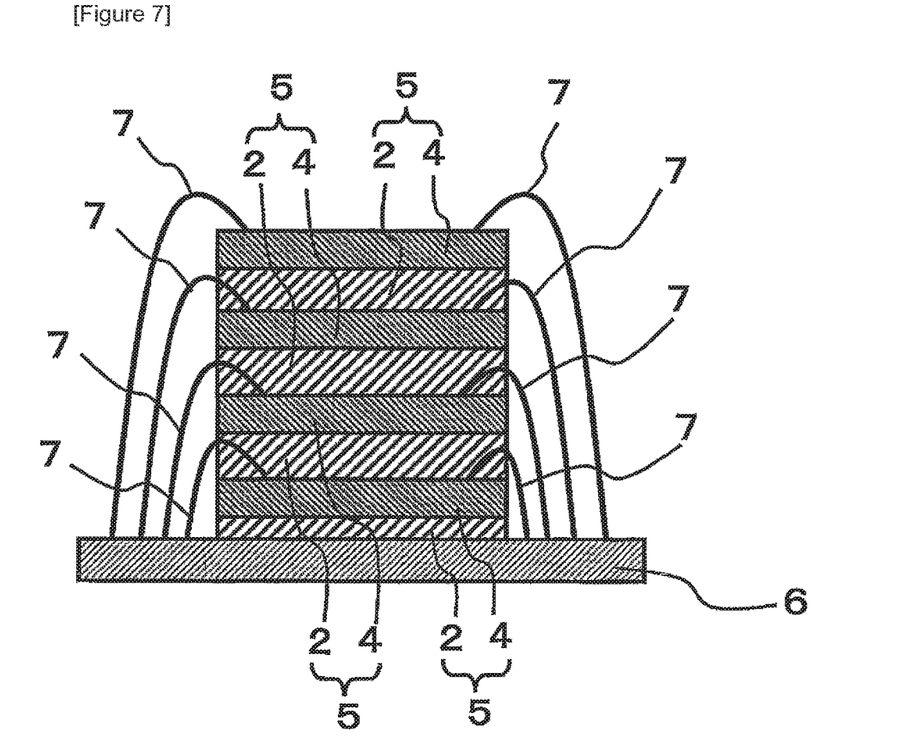
FIG. 7 shows a semiconductor chip with adhesive layer, obtained by making the adhesive layer in FIG. 6 thicker and laminating by implanting the bonding wire.

Further, by thermocompression bonding and thermosetting another semiconductor chip 4 onto the surface of the mounted semiconductor chip 4, and connecting with the circuit board by repeating the wire bonding method, multiple chips may be laminated. For example, as shown in FIG. 6, a method of laminating semiconductor chips by shifting, or as shown in FIG. 7, a method of laminating by implanting the bonding wire 7 by creating a thicker adhesive layer 2 on the second layer, etc., may be adopted.

Figure 8:
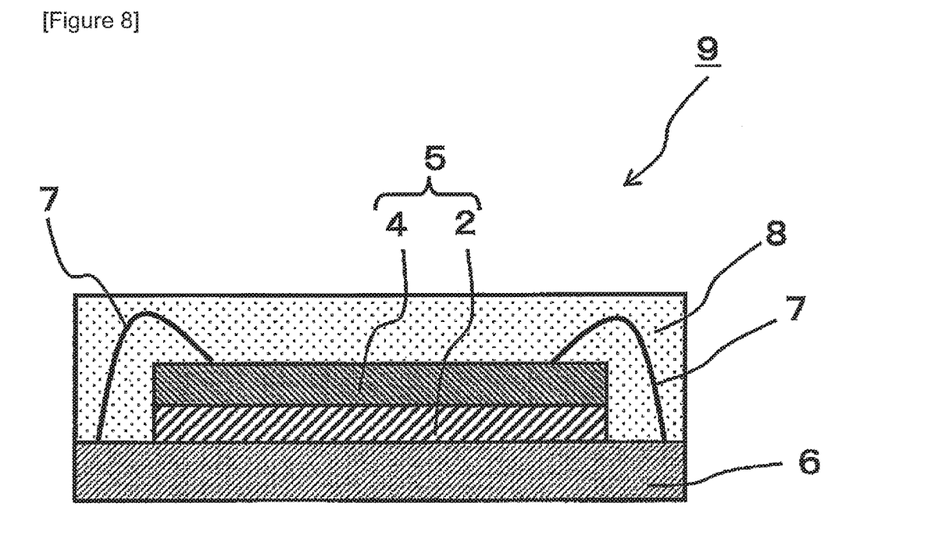
FIG. 8 shows a semiconductor package in which the circuit board and the semiconductor chip with adhesive layer are sealed with a sealing resin.
Figure 9:
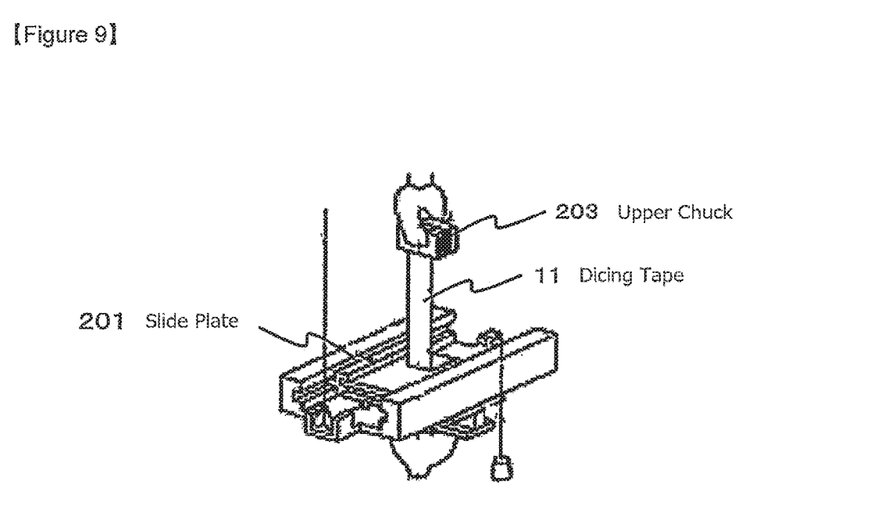
FIG. 9 shows the peeling strength measuring device.

In the method for producing semiconductor package of the present invention, as shown in FIG. 8, it is preferable to seal the circuit board 6 and the semiconductor chip with adhesive layer 5 using a sealing resin 8, to thereby obtain a semiconductor package 9. The sealing resin 8 is not particularly limited, and any known sealing resin used for the production of semiconductor packages may be used appropriately. Further, the method of sealing using a sealing resin 8 is not particularly limited, and any known method may be adopted appropriately.

Example

Hereinafter, the present invention will be described more specifically with reference to the following Examples. However, the present invention is not limited in anyway by these Examples.

Examples and Comparative Examples

A varnish obtained by blending a proper amount of solvent into the components shown in Table 2 was applied on a cover tape comprising a PET film of 50 μm thickness and dried to form a film-form adhesive composition with a thickness of 50 μm, which was then bonded with a dicing tape to prepare an adhesive film with dicing tape.

Note that the methods of evaluation for each property were as follows:

(Measurement of Peeling Strength Between Dicing Tape and Adhesive Film)

The peeling strength between the dicing tape and the adhesive film for each sample was measured according to JIS-Z0237. At standard state (temperature 23° C., relative humidity 50%), the adhesive film 105 was stuck onto the slide plate 201 shown in FIG. 9 via a double-sided fixing tape 103. The tip of the dicing tape 11 was fixed using an upper chuck 203, after which it was peeled at a peeling angle of 90° and a peeling rate of 50 mm/min, to obtain the peeling strength between the dicing tape and the adhesive film.

(Pickup Success Rate and Minimum Wafer-Laminatable Temperature)

The pickup success rate was calculated by subjecting silicon chips with adhesive film diced to a size of 7.5×7.5 mm to 100 pickup tests using a die bonding apparatus (product name: DB-800 by Hitachi High-Technologies Corporation) under the condition of five push-up pins, push-up height of 300 μm, and holding time of 300 msec. Further, the minimum wafer-laminatable temperature was obtained by first laminating the adhesive film, which was cut to a size of 20×100 mm, on the surface of a mirror wafer (8 inches×730 μm thickness) preheated to a specific temperature using a manual wafer mounter (product name: FM-114 by Technovision Inc.) at a roller pressure of 0.3 MPa and a roller speed of 10 mm/sec. After cooling, the cover film on the surface of the adhesive film was peeled off at room temperature, and an adhesive tape (product name: splicing tape No. 642, by Teraoka Seisakusho Co., Ltd.) of the same size as the adhesive film was fixed, taking care not to include bubbles. Then, the adhesive tape was peeled off, and the temperature at which the adhesive film ceased to peel off from the surface of the mirror wafer was determined to be the minimum wafer-laminatable temperature. Note that the temperature was the measured surface temperature of the surface of the mirror wafer during lamination, which was changed at 10° C. at a time, to obtain the minimum temperature at which the adhesive film ceased to peel off from the surface of the mirror wafer. The results were evaluated according to the standards shown in Table 1.

TABLE 1

| Evaluation of Pickup Success Rate | |
|---|---|
| A: | (Good) Pickup Success Rate was 80% or higher |
| B: | (Pass) Pickup Success Rate was 50% or higher and lower than 80% |
| C: | (Fail) Pickup Success Rate was lower than 50% |
| Evaluation of Minimum Wafer-laminatable Temperature | |
| A: | (Good) Minimum Wafer-laminatable Temperature was lower than 80° C. |
| B: | (Pass) Minimum Wafer-laminatable Temperature was 80° C. or higher and lower than 110° C. |
| C: | (Fail) Minimum Wafer-laminatable Temperature was 110° C. or higher |

Further, details of the components and the dicing tape used were as follows:

(1) Insulating Particles:

Spherical silica (product name: FB-3SDX; average particle diameter: 3 μm; by Denka Co., Ltd.)

(2) Conductive Particles:

Mixture of spherical copper powder (product name: F2020; average particle diameter: 3 μm; by Ormet Corporation) and spherical solder powder (product name: ST-3; average particle diameter: 3 μm; by Mitsui Mining and Smelting Co., Ltd.).

(3) Bismaleimide Resin:

A substance with a structure that fulfills the following Chemical Formula 9 (n=1 to 20) in gel form.

[Chemical Formula 9]

(4) Radical Initiator

Dimethyl diphenylbutane (product name: Nofuma BC-90; ten-hour half-life temperature 210° C.; by Nippon Oil and Fats Co., Ltd.)

(5) Coupling Agent

Methacryloxy silane (product name: KBM-503; chemical name: 3-methacryloxy propyl trimethoxysilane; by Shin-Etsu Chemical Co. Ltd.)

Acryloxy silane (product name: KBM-5103; chemical name: 3-acryloxy propyl trimethoxysilane; by Shin-Etsu Chemical Co., Ltd.)

Epoxy silane (product name: KBM-403; chemical name: 3-glycidoxy propyl trimethoxysilane; by Shin-Etsu Chemical Co., Ltd.)

Amino silane (product name: KBM-573; chemical name: n-phenyl-3-amino propyl trimethoxysilane; by Shin-Etsu Chemical Co., Ltd.)

(6) Dicing Tape

A dicing tape produced by the following method.

<Method for Producing Adhesive Film>

(Pressure-Sensitive Adhesive Layer Composition)

77 parts by mass of 2-ethylhexyl acrylate and 23 parts by mass of 2-hydroxypropyl acrylate were polymerized to obtain an acryl copolymer with a weight-average molecular weight of 800,000. 3 parts by mass of polyisocyanate was added and mixed to obtain an adhesive layer composition.

(Dicing Tape)

The adhesive layer composition obtained was applied to a PET film, which serves as the releasing film, so that the dried film thickness became 10 μm, and was dried at 120° C. for 3 minutes. The adhesive layer composition applied onto the PET film was transferred onto a polypropylene-elastomer (an elastomer of PP:HSBR=80:20) resin film with a thickness of 100 which was the supporting substrate, to thereby produce the DC tape.

Note that NOVATEC FG4 (product name) of Japan Polychem Corporation was used as the polypropylene (PP), and DYNARON1320P (product name) of JSR Corporation was used as the hydrogenated styrene-butadiene (HSBR). Further, as the PET film, a silicone release-processed PET film (Purex S-314 (product name), thickness 25 μm of Teijin DuPont Films Japan Limited) was used.

TABLE 2

| Case | | | Example 1 | Example 2 | Example 3 | Example 4 | Example 5 | Comparative Example 1 | Comparative Example 2 | Comparative Example 3 |
|---|---|---|---|---|---|---|---|---|---|---|
| Composition [% by mass] | Filler | Insulating particle | 75.0 | 75.0 | 75.0 | 50.0 | | 75.0 | 75.0 | 75.0 |
| | | Conductive particle | | | | | 94.0 | | | |
| | | Bismaleimide | 23.0 | 23.0 | 19.3 | 46.0 | 5.5 | 23.9 | 23.0 | 23.0 |
| | | Radical Initiator (2,3-dimethyl-2,3-diphenylbutane) | 1.1 | 1.1 | 0.9 | 2.2 | 0.3 | 1.1 | 1.1 | 1.1 |
| | Coupling Agent | Methacryloxysilane | 0.9 | | | | | | | |
| | | Acryloxysilane | | 0.9 | 4.8 | 1.8 | 0.2 | | | |
| | | Epoxysilane | | | | | | | 0.9 | |
| | | Aminosilane | | | | | | | | 0.9 |
| | | Total | 100.0 | | | | | | | |

TABLE 2-continued

| Case | | Example 1 | Example 2 | Example 3 | Example 4 | Example 5 | Comparative Example 1 | Comparative Example 2 | Comparative Example 3 |
|---|---|---|---|---|---|---|---|---|---|
| Property | Peel Strength with DC tape [mN/10 mm] | 54 | 190 | 100 | 290 | 140 | 650 | 650 | 710 |
| | Pickup Success Rate [%] | 83% A | 100% A | 100% A | 66% B | 100% A | 0% C | 0% C | 0% C |
| | Minimum Wafer-laminatable Temperature [° C.] | 90 B | 70 A | 70 A | 60 A | 100 B | 60 A | 60 A | 60 A |

In Examples 1 to 4, high pickup success rates were obtained. In particular, in Example 2, by adding a proper amount of acryloxy silane-type coupling agent, the chemical reaction proceeded to a moderate degree. Thus, excellent pickup property was obtained without impairing the low-temperature sticking property to the silicon wafer.

Further, in Example 5, wherein the filler content ratio was drastically increased for functional expression of the adhesive film, significant effects similar to those seen in Example 2 were obtained by adding a proper amount of acryloxy silane-type coupling agent.

DESCRIPTION OF NOTATIONS

101 . . . substrate
103 . . . pressure-sensitive adhesive layer
105 . . . adhesive film (thermosetting-type adhesive film)
1 . . . semiconductor wafer
2 . . . adhesive layer
3 . . . dicing tape
4 . . . semiconductor chip
5 . . . semiconductor chip with adhesive layer
6 . . . circuit board
7 . . . bonding wire
8 . . . sealing resin
9 . . . semiconductor package
10 . . . adhesive film with dicing tape
11 . . . dicing tape
201 . . . slide plate
203 . . . upper chuck

The invention claimed is:

1. An adhesive film, which comprises: (A) a bismaleimide resin; (B) a radical initiator; and (C) a coupling agent that contains a (meth)acrylic group, wherein at least one of the following applies:
 (1) radical initiator (B) has a one-hour half-life temperature of 140° C. or higher, or
 (2) a filler (D) is present, having a content of 75 percent or higher by mass based on 100 percent by mass in the adhesive film.

2. The adhesive film according to claim 1, wherein (1) applies and a content of (A) is 1 to 50 percent by mass, a content of (B) is 0.1 to 5 percent by mass, and a content of (C) is 0.1 to 5 percent by mass in the adhesive film.

3. An adhesive film with a dicing tape, which comprises the adhesive film according to claim 1 laminated onto the dicing tape.

4. A semiconductor package that comprises the adhesive film with the dicing tape according to claim 3.

5. The adhesive film according to claim 1, wherein at least (1) applies.

6. The adhesive film according to claim 1, wherein at least (2) applies.

7. The adhesive film according to claim 1, wherein (1) and (2) apply.

8. The adhesive film according to claim 5, wherein the one-hour half-life temperature of 170° C. or higher.

9. The adhesive film according to claim 5, wherein the one-hour half-life temperature of 200° C. or higher.

10. The adhesive film according to claim 5, wherein the one-hour half-life temperature of 250° C. or lower.

11. The adhesive film according to claim 1, wherein the bismaleimide resin contains a structure having the following general formula:

wherein Q is a substituted or unsubstituted aliphatic, aromatic, heteroaromatic, siloxane part, or a combination thereof.

12. The adhesive film according to claim 11, wherein Q has a structure in which an alicyclic hydrocarbon with 5 to 8 carbons is substituted by four alkyl groups with 4 to 12 carbons.

13. The adhesive film according to claim 12, wherein Q has a structure containing a cyclohexane-based core and four arms attached to the core and having the following general formula:

* * * * *